United States Patent
Kacker et al.

(10) Patent No.: US 8,242,593 B2
(45) Date of Patent: Aug. 14, 2012

(54) CLUSTERED STACKED VIAS FOR RELIABLE ELECTRONIC SUBSTRATES

(75) Inventors: Karan Kacker, Atlanta, GA (US);
Douglas O. Powell, Endicott, NY (US);
David L. Questad, Hopewell Junction, NY (US); David J. Russell, Owego, NY (US); Sri M. Sri-Jayantha, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 530 days.

(21) Appl. No.: 12/020,565

(22) Filed: Jan. 27, 2008

(65) Prior Publication Data

US 2009/0189290 A1    Jul. 30, 2009

(51) Int. Cl.
*H01L 23/04* (2006.01)
*H01L 23/48* (2006.01)
*H01L 23/52* (2006.01)
*H01L 29/40* (2006.01)

(52) U.S. Cl. .. 257/698; 257/773; 257/774; 257/E23.011

(58) Field of Classification Search ............... 257/773, 257/774, 698, E23.011
See application file for complete search history.

(56) References Cited

U.S. PATENT DOCUMENTS

| | | | |
|---|---|---|---|
| 5,027,255 A * | 6/1991 | Zeitlin et al. | 361/739 |
| 5,898,217 A * | 4/1999 | Johnston | 257/691 |
| 6,900,395 B2 | 5/2005 | Jozwiak | |
| 7,115,505 B2 * | 10/2006 | Hartwell | 438/667 |
| 2005/0156319 A1 * | 7/2005 | Oggioni et al. | 257/774 |
| 2005/0161837 A1 * | 7/2005 | Matsui | 257/797 |

FOREIGN PATENT DOCUMENTS

| CN | 1281331 A | 1/2001 |
|---|---|---|
| WO | WO2006/009274 A | 1/2006 |

* cited by examiner

*Primary Examiner* — Shouxiang Hu
(74) *Attorney, Agent, or Firm* — Michael J. Buchenhorner; Vazken Alexanian

(57) ABSTRACT

A substrate via structure for stacked vias in a substrate/chip assembly includes: a center via stack and a plurality of stacked vias clustered around the center via stack. In this structure, the center via and the surrounding vias are made of copper. Some of the surrounding vias may be non-functional vias and these may be of a different height than the functional vias.

8 Claims, 5 Drawing Sheets

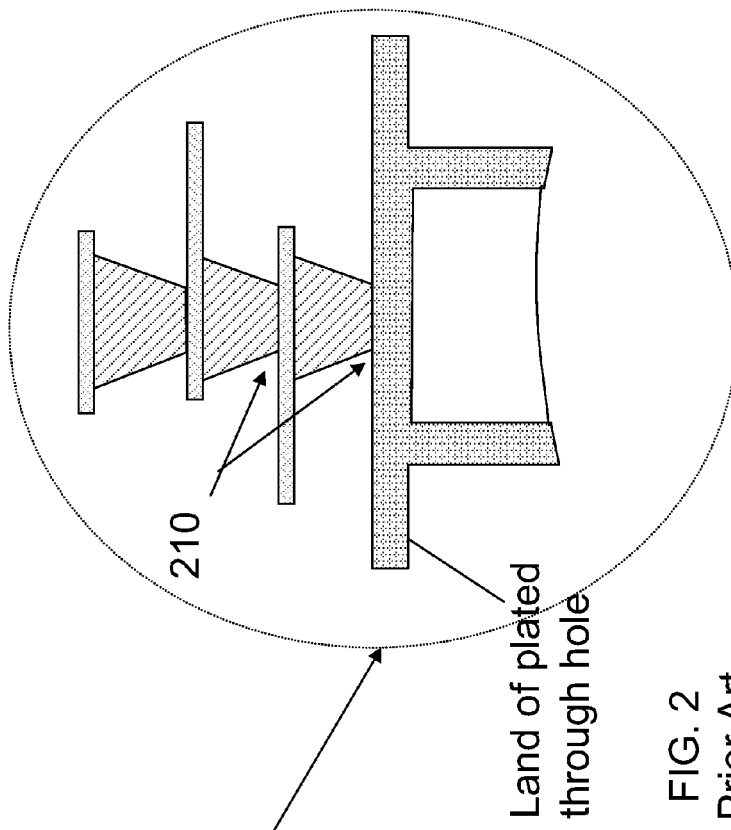
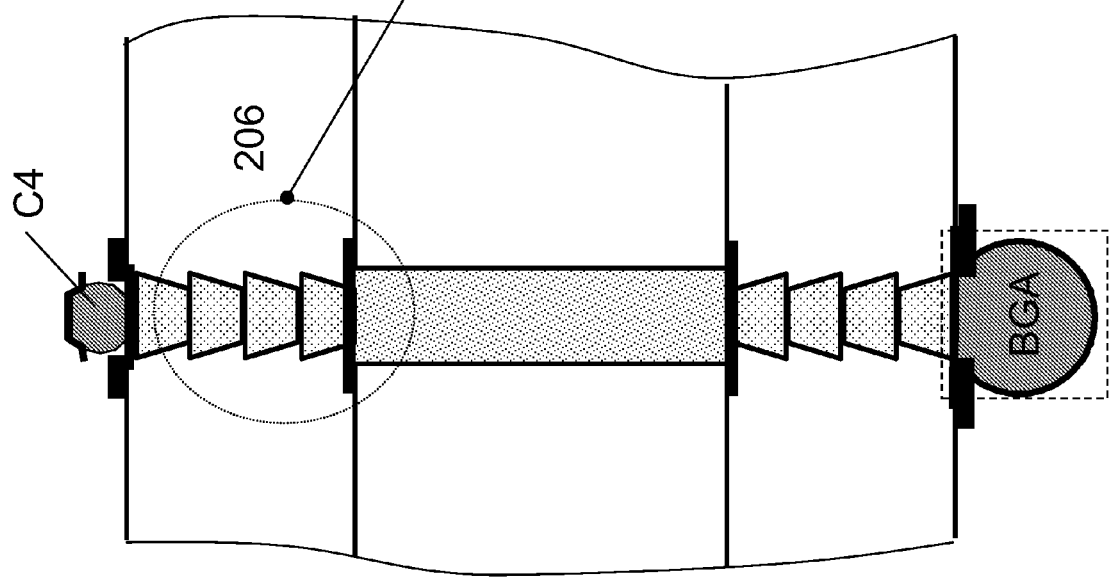
FIG. 2
Prior Art

Via-Concept-Clusters

CLUSTERED STACKED VIAS FOR RELIABLE ELECTRONIC SUBSTRATES

CROSS-REFERENCE TO RELATED APPLICATIONS

A via system designed to reduce Z-axis strain has been disclosed in commonly-owned, co-pending U.S. patent application Ser. No. 12/020,534, "Construction Of Reliable Stacked Via In Electronic Substrates—Vertical Stiffness Control Method," filed on Jan. 26, 2008. An embedded constrainer disc system around a stack via to reduce the in-plane strain has also been disclosed in commonly-owned, co-pending U.S. patent application Ser. No. 12/020,561, "Embedded Constrainer Discs For Reliable Stacked Vias In Electronic Substrates," filed on Jan. 27, 2008.

STATEMENT REGARDING FEDERALLY SPONSORED-RESEARCH OR DEVELOPMENT

None.

INCORPORATION BY REFERENCE OF MATERIAL SUBMITTED ON A COMPACT DISC

None.

FIELD OF THE INVENTION

The invention disclosed broadly relates to the field of manufacturing electronic substrates and more particularly relates to the field of stacked vias on electronic substrates.

BACKGROUND OF THE INVENTION

FIG. 1 shows two key components of an electronic module. A chip 100 is made of silicon on which electronic circuits are fabricated. A substrate 102 is made of organic materials embedded with copper interconnects. A substrate 102 facilitates electrical interconnection of the chip to external electronic circuits on a motherboard.

The density of connection points (controlled collapse chip connection, or "C4s") between a chip 100 and a substrate 102 is a critical parameter. A larger number of C4s requires multiple build-up layers 104 to achieve the needed electrical connections to the motherboard. A typical substrate 102 may have four build-up layers 104 on top and bottom and support about 3,000 C4s. FIG. 1 shows stacked vias 106 as well as staggered vias 108 needed to complete the interconnection. Stacked vias 106 are often preferable because they achieve a C4 connection density upwards of 20% as compared to a staggered via 108.

FIG. 2 shows the known art with regard to a stacked via 206 and a plated through hole 210 (PTH). An individual stacked via 206 as shown in FIG. 2 accumulates various levels of strain as it is thermally cycled. In a planar view the stacked vias 206 are located wherever it is convenient to embed them by the electrical designer of a substrate. The coefficient of thermal expansion (CTE) of various materials used to construct a module is not matched and is known to drive thermomechanical stresses within a module. Repeated thermal cycling of an electronic module exhibits failure at via interface regions due to thermomechanically driven accumulated strain. An individual via stack 206 is strained along the Z-axis as well as the (X-Y) plane by the CTE-driven thermo-mechanical stresses.

SUMMARY OF THE INVENTION

Briefly, according to an embodiment of the invention, a method for creating a clustered via structure includes steps or acts of: creating a center via stack for electrical interconnects in a substrate/chip assembly; and adding additional via stacks surrounding the center via stack. Some of the additional via stacks may be non-functional and may be of a different height than the functional via stacks.

A substrate via structure for stacked vias in a substrate/chip assembly includes: a center via stack and a plurality of stacked vias clustered around the center via stack. In this structure, the center via and the surrounding vias are made of copper. Some of the surrounding vias may be non-functional vias and these may be of a different height than the functional vias.

BRIEF DESCRIPTION OF THE DRAWINGS

To describe the foregoing and other exemplary purposes, aspects, and advantages, we use the following detailed description of an exemplary embodiment of the invention with reference to the drawings, in which:

FIG. 2 shows the stacked via of an electronic module, according to the known art;

Figure 1:
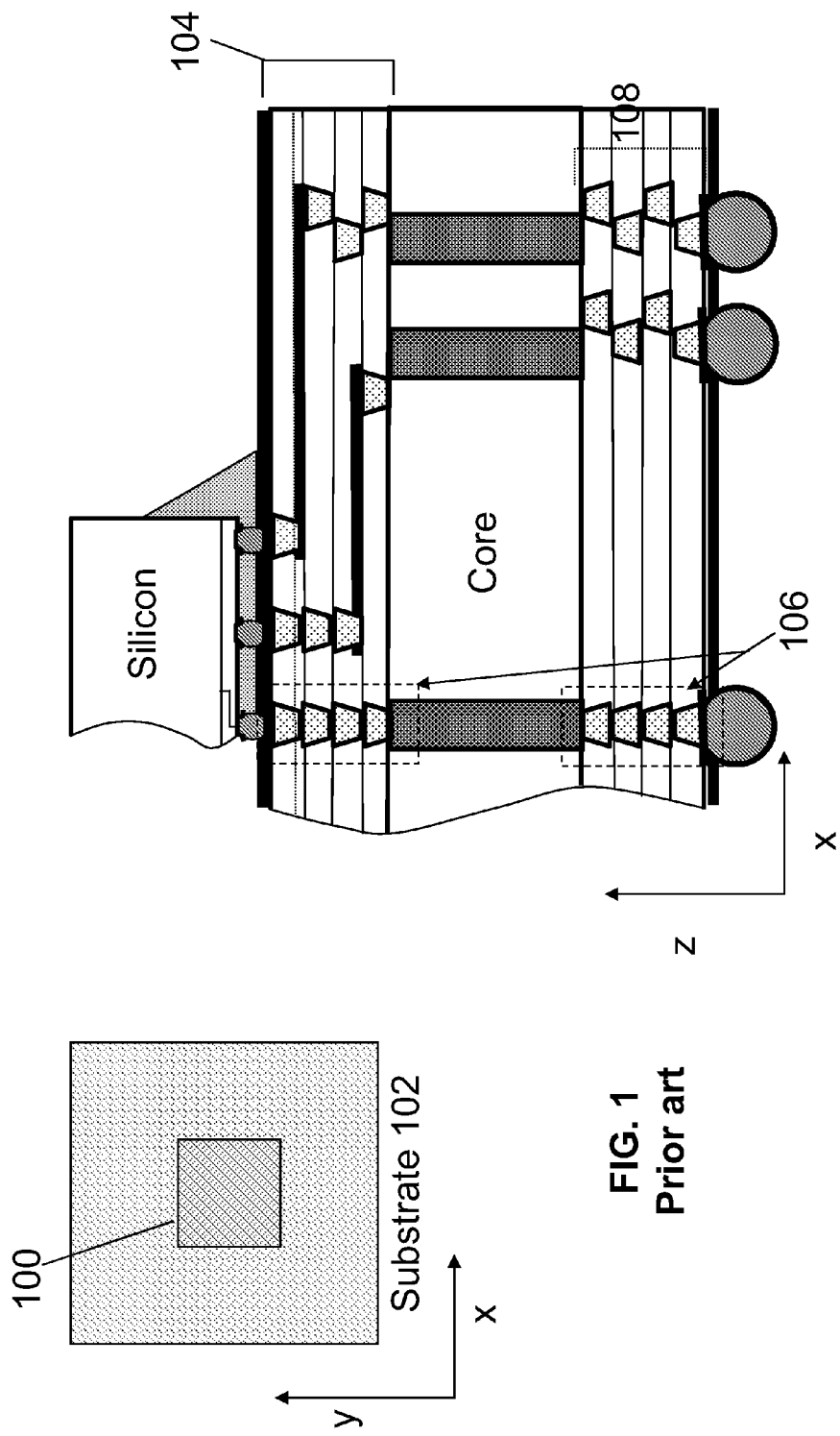
FIG. 1 shows a basic electronic module, according to the known art.

While the invention as claimed can be modified into alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the present invention.

DETAILED DESCRIPTION

Figure 3:
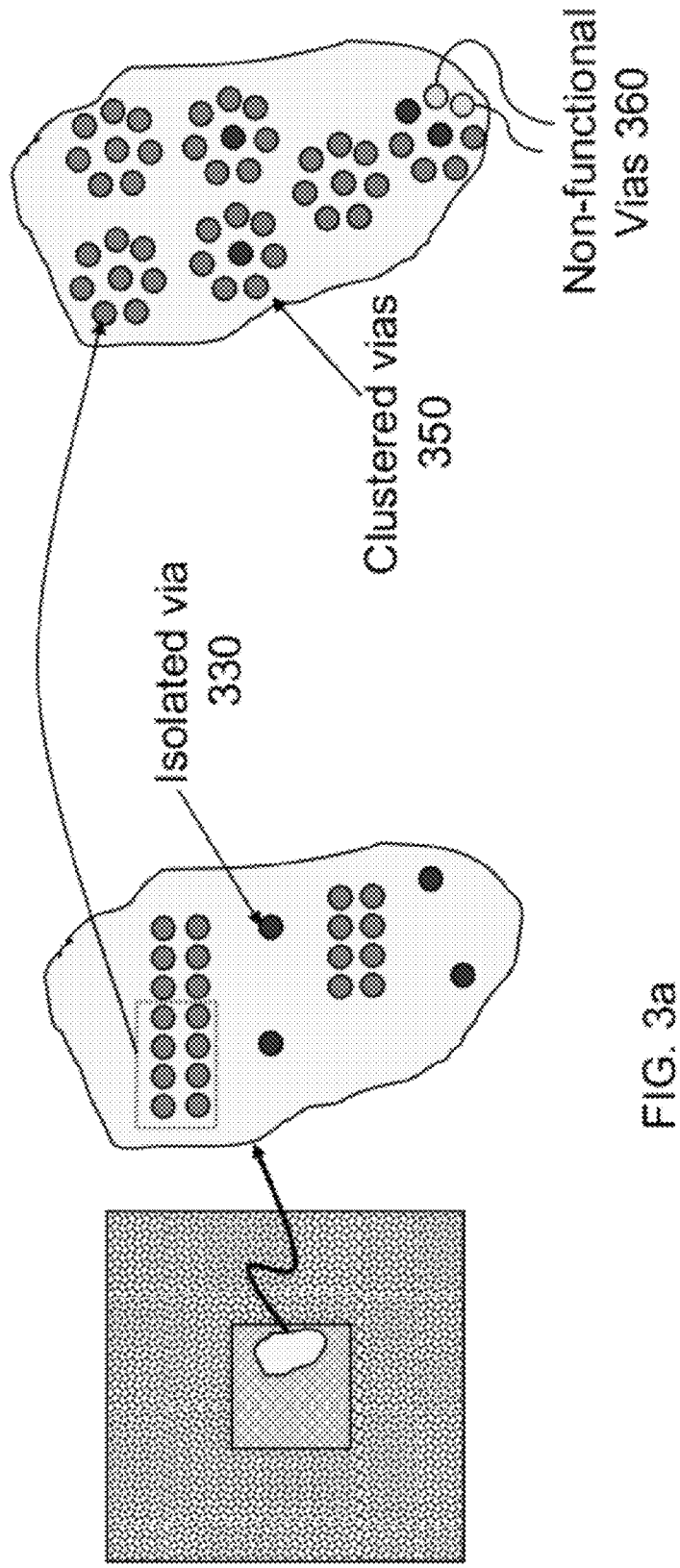
FIG. 3A shows isolated vias, according to the known art.
FIG. 3B shows clustered vias, according to an embodiment of the present invention.
Figure 4:
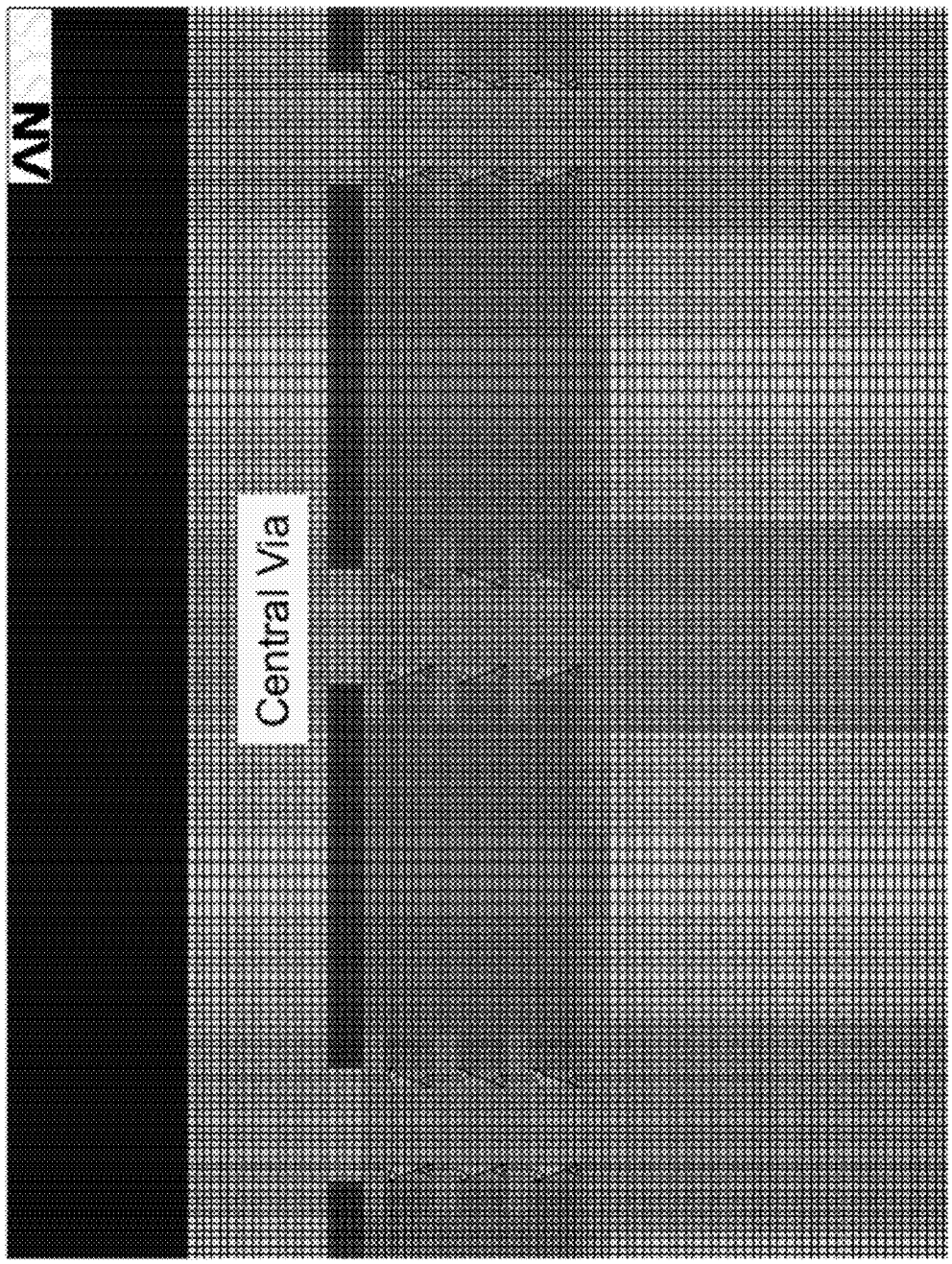
FIG. 4 shows a clustered via analysis, according to an embodiment of the present invention.

We describe a via structure design for reducing strain on individual via stacks. Referring now in specific detail to the drawings, and particularly FIG. 3, there is illustrated a via stack design according to an embodiment of the present invention. FIG. 3 shows a design that reduces the effective strain on an individual via stack by actively clustering a group of vias 350. During a thermal cycle (e.g., 125° C. to −55° C.) as the build-up layers (with a CTE ~30 ppm/° C.) shrink along the Z axis as well as in-plane (X-Y) much faster than the Cu-via (with a CTE ~16), an individual stacked via 330 has to single-handedly resist the thermomechanical forces produced by the surrounding build-up layer.

By clustering several stacked vias 350 together and by avoiding an isolated via 330, the load-carrying capacity of the clustered via 350 is enhanced without excessive plastic strain. It is known that the life-time of a via is non-linearly dependent on its plastic strain. Elastic strain in a material is reversible, whereas a plastic strain is irreversible. When the applied stress is removed an elastic deformation reverts back to its original shape whereas a plastic strain does not. Plastic strain, when produced repeatedly due to thermal cycling, is known to generate fatigue failure in materials. Thus it is important to minimize the plastic strains encountered by critical components within an electronic assembly.

Clustering of vias produces united resistance along the Z-axis as well as in the X-Y plane simultaneously. In essence, by increasing the copper content in relation to the build-up layer material, the clustered via stack 350 is better protected from plastic deformation.

Figure 5:
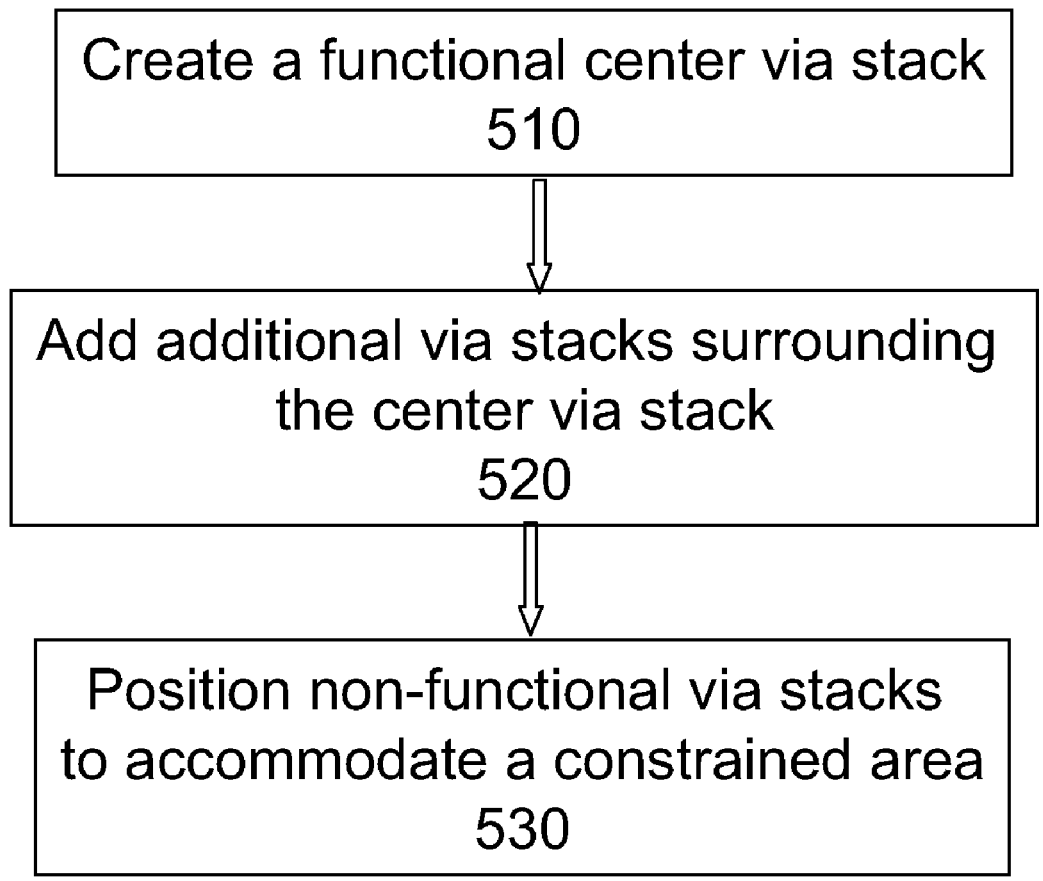
FIG. 5 is a flow chart of a method for clustering stacked vias, according to an embodiment of the present invention.

Referring to FIG. 5 there is shown a flow chart of the process for creating clustered via stacks. In step 510, the center via is positioned. The location of the center via is kept constant with respect to a substrate/chip assembly. In step 520 additional vias are progressively added (1, 2 and so on.) on opposite sides of the center via. The following cumulative strain per deep thermal cycle (DTC) can be observed:

Base-line data with central via=0.7459%
Central via plus one on each side=0.7399%
Central via plus two on each side=0.7408%

The analysis shows that a single encirclement of an isolated via 330 produces an improved tolerance (i.e., a reduced strain). Adding an extra encirclement does not produce commensurate improvement. A three-dimensional (3D) formulation produces a similar trend as that of a two-dimensional (2D) model but the relative difference in strains between configurations typically is emphasized more.

While clustering vias for reducing strain, it may be possible to introduce surrounding via stacks 360 that are not required by the electrical circuits. In step 430, the surrounding via stacks 360 may have a different (smaller) total height compared to a functional via in order to be accommodated in a constrained surrounding. A constrained surrounding may have circuit interconnects on a top layer thus preventing a full height stack via.

As has been shown, there is an advantage in clustering a group of stacked vias in the design of an organic substrate even though it forces the designer to avoid isolated stacked vias 330.

Therefore, while there has been described what is presently considered to be the preferred embodiment, it is understood by those skilled in the art that other modifications can be made within the spirit of the invention.

The invention claimed is:

1. A substrate via structure for stacked vias in a substrate/chip assembly, the via structure comprising:
   a center via stack;
   a plurality of stacked vias clustered around and surrounding the center via stack, wherein the plurality of the stacked vias encircle the center via stack resulting in no isolated via stacks on the structure, said plurality of stacked vias comprising:
      functional vias supporting electrical interconnects; and
      non-functional vias that do not support electrical interconnects, said non-functional vias having a shorter height than the functional vias to accommodate a constrained surrounding; and
   a build-up layer within which the center via stack and the plurality of stacked vias are formed.

2. The structure of claim 1 wherein the plurality of the stacked vias are copper vias.

3. The structure of claim 1 wherein the center via stack comprises copper vias.

4. The structure of claim 1 wherein the plurality of the stacked vias comprises seven stacked vias encircling the center via stack.

5. The structure of claim 4 further comprising additional stacked vias surrounding the center via stack.

6. The structure of claim 1 wherein a position of the center via stack is kept constant with respect to the plurality of the stacked vias clustered around the center via stack.

7. The structure of claim 3 wherein a copper content of the center via stack and the surrounding via stacks is increased with respect to build-up layer material thus providing better protection from plastic deformation.

8. The structure of claim 1 wherein the non-functional vias are positioned to accommodate a constrained area.

\* \* \* \* \*